United States Patent
Park et al.

(10) Patent No.: US 7,265,327 B1
(45) Date of Patent: Sep. 4, 2007

(54) PHOTODETECTING SENSOR ARRAY

(75) Inventors: Byung Park, San José, CA (US); Richard Weisfield, Los Altos Hills, CA (US); William Yao, Los Altos, CA (US)

(73) Assignee: dpiX, L.L.C., Palo Alto, CA (US)

( * ) Notice: Subject to any disclaimer, the term of this patent is extended or adjusted under 35 U.S.C. 154(b) by 188 days.

(21) Appl. No.: 10/775,592

(22) Filed: Feb. 9, 2004

(51) Int. Cl.
 *H01L 27/00* (2006.01)
(52) U.S. Cl. .................... 250/208.1; 348/302
(58) Field of Classification Search ......... 250/208.1, 250/370.01, 370.14; 348/294, 302; 257/292, 257/291
See application file for complete search history.

(56) References Cited

U.S. PATENT DOCUMENTS 6,252,215 B1 * 6/2001 Mei et al. .............. 250/208.1
2001/0001562 A1 * 5/2001 Orava et al. ............ 348/302
2002/0005474 A1 * 1/2002 Goto .................. 250/208.1
2002/0036257 A1 * 3/2002 Yamashita et al. ..... 250/208.1
2002/0036700 A1 * 3/2002 Merrill ................. 348/308
2003/0117510 A1 * 6/2003 Sakurai et al. .......... 348/308

* cited by examiner

*Primary Examiner*—Georgia Epps
*Assistant Examiner*—Kevin Wyatt
(74) *Attorney, Agent, or Firm*—Blakely, Sokoloff, Taylor & Zafman LLP

(57) ABSTRACT

Photodetecting devices or arrays and methods of making such devices or arrays. In one exemplary embodiment, a photodetecting array includes a plurality of detecting cells arranged in an array, each of the detecting cells including a photodiode, a plurality of data lines coupled to the detecting cells, and a mesh of bias voltage lines which comprise first bias lines disposed substantially parallel to gate lines which are coupled to the detecting cells and second bias lines disposed substantially perpendicularly to the gate lines, wherein the total length of the first bias lines exceeds a total length of the second bias lines.

28 Claims, 13 Drawing Sheets

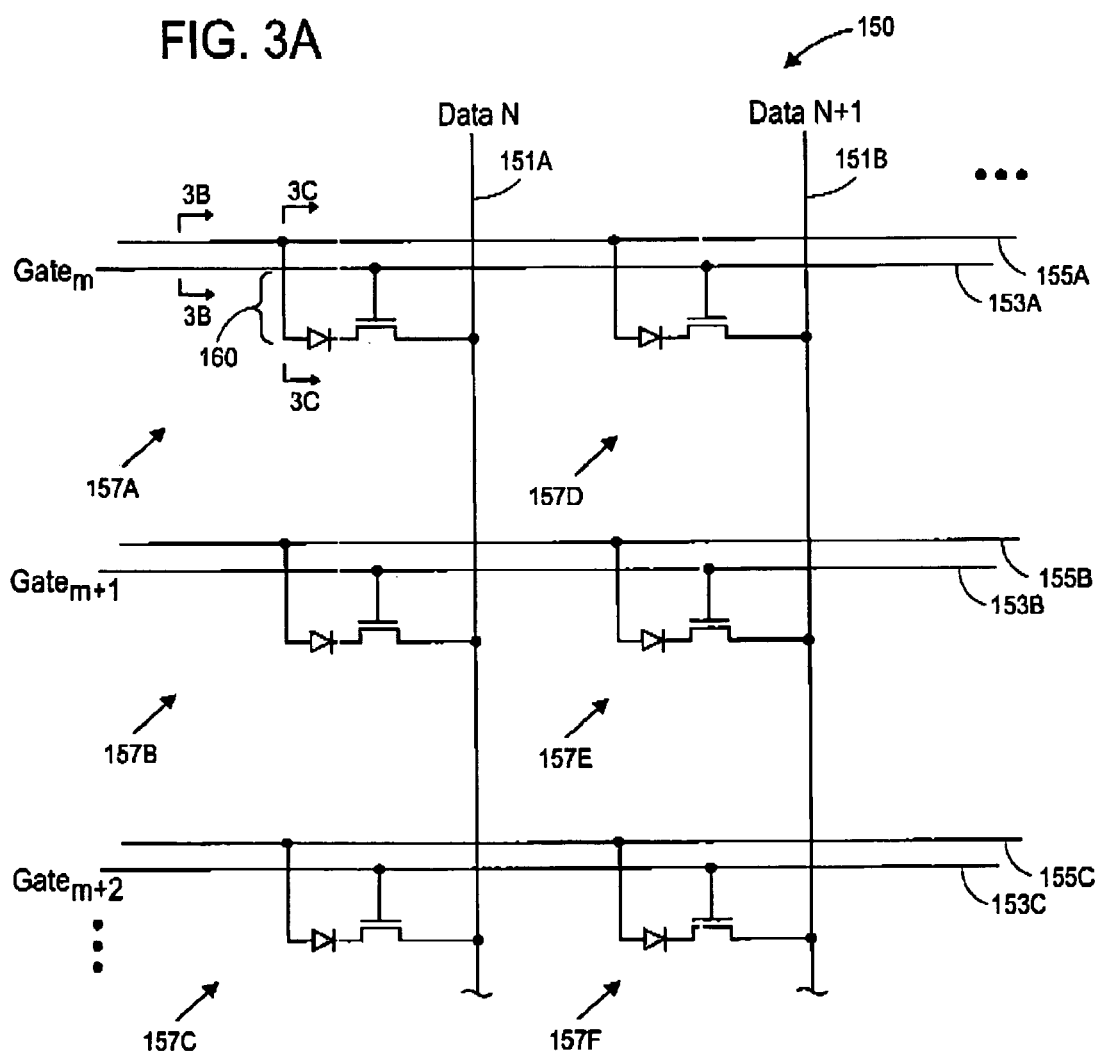

PHOTODETECTING SENSOR ARRAY

FIELD OF THE INVENTION

This disclosure relates to imaging devices.

BACKGROUND OF THE INVENTION

The present invention relates generally to photodetection devices and more particularly to photodetecting arrays, such as photodiode imaging devices.

Imaging devices such as scanners, photocopiers, or radiation imagers can use a sensor sheet comprising a two dimensional layer of photodiodes which senses an image directed onto it. Each photodiode is connected to a transistor. When light strikes a particular photodiode, an electrical charge is generated by the photodiode. The transistor, which is coupled to that photodiode, switches the charge generated by the photodiode to other components such as an amplifier which amplifies the signal.

Conventionally, an active matrix array is a grid of pixels on a substrate with an active switching device, such a thin film transistor in the array. An active matrix imaging array of this type typically has a detecting cell which forms the pixel, where the detecting cell includes the thin film transistor and a photodiode on the same substrate surface.

FIG. 1 shows a cross sectional view of a photodetecting device of the prior art. This figure is taken from U.S. Pat. No. 5,619,033, which is hereby incorporated herein by reference. FIG. 1 shows a photodetecting device 92, which includes a thin film field effect transistor (TFT) 35. The TFT 35 comprises a metal gate electrode 1 formed on a substrate 5. The metal typically comprises refractory metals such as a titanium tungsten (TiW) layer which covers an aluminum layer. Other refractory metals such as chromium, molybdenum, or tantalum are suitable alternatives. A gate dielectric layer 10 of silicon nitride is formed over the gate electrode and the substrate 5. A layer of hydrogenated amorphous silicon 15 is formed over the gate dielectric layer 10. An etchstop 30 is formed from a layer of silicon nitride over the hydrogenated amorphous silicon layer 15. An n+ layer 20 is formed over the layer 15 and partially over the etchstop layer 30 as shown in FIG. 1. A titanium tungsten metal layer 25 is formed over the n+ layer 20 and an aluminum layer 26 is formed over the titanium tungsten layer 25. The titanium tungsten metal layer 25 serves as a barrier layer preventing the aluminum layer 26 from interacting with the n+ layer 20. Other suitable refractory metals besides titanium tungsten may also be used. The n+ layer 20, the titanium tungsten metal layer 25 and the aluminum layer 26 on the left side of the etchstop 30 form the source electrode 37 of the thin film transistor 35, and the n+ layer 20, the titanium tungsten metal layer 25 and the aluminum layer 26 on the right side of the etchstop 30 form the drain electrode 38 of the thin film transistor 35.

A photodiode structure is then formed over the thin film transistor 35 as shown in FIG. 1. This photodiode is segmented so that each detecting cell has its own photodiode as describe in U.S. Pat. No. 5,619,033. Further details regarding the formation and structure of the detecting cells shown in FIG. 1 can be found in that US patent.

During operation of the array, the thin film transistor 35 is turned off to allow the photodiode 99 to accumulate charge based upon incident electro magnetic radiation, such as visible light or x-rays. This accumulated charge is a received image signal. When a control signal is received from an external controller (not shown) the thin film transistor 35 turns on and transfers the accumulated charge of the photodiode 99 to the other components (not shown) that amplify and process the received image signal.

The photodiode 99 is biased by applying a voltage to the bias contact 90. This bias voltage reverse biases the photodiode 99 during normal operation of the device. The bias voltage induces an electric field in the amorphous hydrogenated silicon layer 60. When light enters this layer 60, electron-hole pairs are created. The electrons and holes are swept by the electric field to opposite sides of the photodiode 99 and accumulate near the photodetector electrode contacts which are the conductive layer 70 and the n+ doped layer 55. When the thin film transistor 35 is turned on, the accumulated charges are allowed to flow as current through the source electrode 37 to other components such as the amplifiers which amplify the detected signal.

FIG. 2 shows an electrical schematic of a conventional photodetecting array which in this figure shows four detecting cells 105A, 105B, 105C, and 105D in the array 101. The array includes two gate lines 102A and 102B and two data lines 103A and 103B. The array also includes two bias lines 104A and 104B which are typically coupled to receive the same bias voltage which is typically a constant negative DC voltage in order to reverse bias the photodiode in each detecting cell. This reverse biasing prevents the photodiode from leaking in the dark as is well known in the art. The electrical schematic of FIG. 2 also represents the layout of an array in the prior art in which the bias lines are parallel and often adjacent to the data lines as shown in FIG. 2. Each detecting cell includes a thin film field effect transistor, such as field effect field transistors 107A, or 107B, or 107C, or 107D. Further, each detecting cell includes a photodiode such as the photodiode 109A, or 109B, or 109C, or 109D. The source electrode of each field effect transistor is coupled to a respective data line and the drain of each field transistor is coupled to the N electrode, of its corresponding photodiode. The p electrode of each photodiode is coupled to its corresponding bias line as shown in FIG. 2. The gate electrode of each field effect transistor is coupled to its corresponding gate line.

One problem with a prior art array such as that shown in FIG. 2 is the fact that the bias line may capacitively couple with its corresponding data line, thereby possibly causing errors.

SUMMARY OF THE DESCRIPTION

Various photodetecting arrays and methods for making photodetecting arrays are described herein. In one exemplary embodiment, a photodetecting array includes a plurality of detecting cells arranged in an array, and a staircase gird of bias lines coupled to the plurality of detecting cells, and a plurality of gate lines coupled to the plurality of detecting cells and a plurality of data lines coupled to the plurality of detecting cells. In one implementation of this embodiment, the bias lines are formed in a mesh which includes first bias lines disposed in a first direction which is substantially parallel to the gate lines and second bias lines disposed in a second direction which is substantially perpendicular to the gate lines, wherein a total length of the first bias lines exceeds a total length of the second bias lines.

Certain embodiments described herein also include another aspect relating to a pixel defect correcting portion of bias voltage lines. In one exemplary embodiment according to this aspect, a photodetecting array includes a plurality of detecting cells arranged in an array, where each of the detecting cells includes a photodiode and a transistor. The array further includes a plurality of gate lines coupled to the detecting cells and a plurality of data lines coupled to the detecting cells and a plurality of bias voltage lines. Each of the bias voltage lines includes at least a pixel defect correcting portion which couples each bias voltage line to a corresponding photodiode, wherein the pixel defect correcting portion is capable of disconnecting the bias voltage line from the corresponding photodiode.

Other exemplary arrays are also described and methods for making these and other arrays are also described.

BRIEF DESCRIPTION OF THE DRAWINGS

The various embodiments will be described with reference to the following drawings which should be considered illustrative of various embodiments and not restrictive.

FIG. 3A shows an electrical schematic, and to some extent a layout architecture, of an exemplary photodetecting array of the present invention.

DETAILED DESCRIPTION

Figure 1:
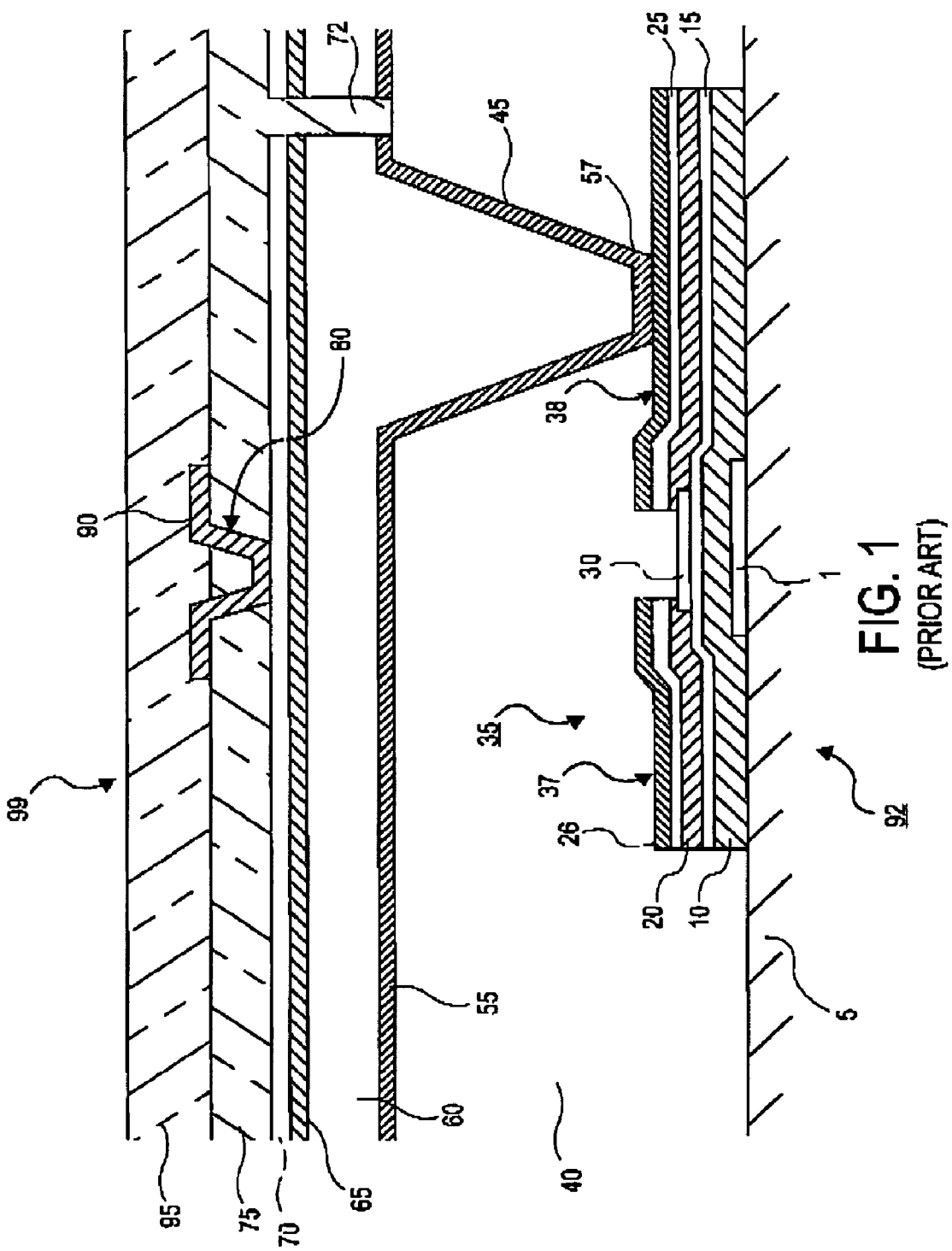
FIG. 1 is a cross sectional view of a prior art photodetection device.

In the following description, numerous specific details are set forth such as examples of specific circuits, processes, etc. in order to provide thorough understanding of the present invention. It would be apparent however to those skilled in the art that these specific details need not be employed to practice the present invention. In other instances well known components or methods have not been described in detail in order to avoid unnecessarily obscuring the present invention. It will be appreciated that, in the drawings, like references indicate similar elements.

Figure 2:
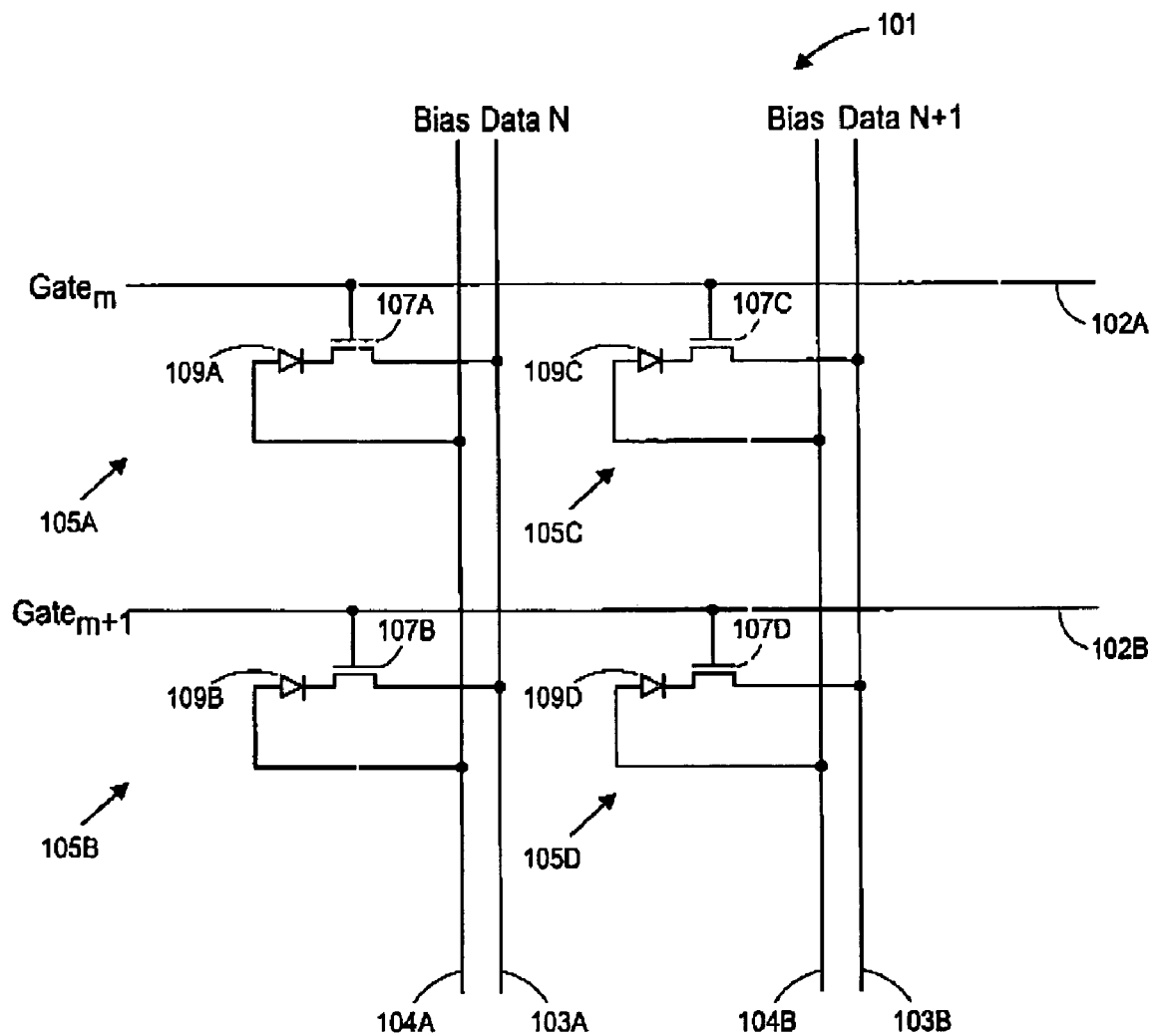
FIG. 2 is an electrical schematic of a prior art photodetecting array.

FIG. 3A shows an example of a photodetecting array according to one exemplary embodiment of the present invention. The array 150 shown in FIG. 3A includes a plurality of detecting elements 157A, 157B, 157C, 157D, 157E, and 157F. It will be appreciated that an array may include additional elements such as additional detecting cells and typically also includes other components such as sense amplifiers, gate line drivers and other components which are known in the art. Each detecting cell includes a thin film field effect transistor as well as a photodiode as shown in FIG. 3A. Each detecting cell is coupled to one gate line, one data line and one bias voltage line, as shown in FIG. 3A. The array 150 includes two data lines 151A and 151B. The field effect transistor in each detecting cell is coupled, through its source electrode to its corresponding data line as shown in FIG. 3A. The drain of each field effect transistor in each detecting cell is coupled to the n electrode of the photodiode, and the p electrode of that photodiode is coupled to the corresponding bias voltage line as shown in FIG. 3A. The array 150 also includes a plurality of gate lines 153A, 153B, and 153C, (which are coupled to the gate electrodes of the field effect transistors as shown) and also includes a plurality of bias voltage line 155A, 155B, and 155C, which receive the same common negative bias voltage from a bias voltage generating source. The array 150 operates in a manner which is similar to the array shown in FIG. 2 with the exception due to the arrangement of the bias lines which are parallel with and potentially proximate to corresponding gate lines which reduces cross coupling capacitance. In the array 150, an image is exposed by turning off all field effect transistors; this may occur by setting each of the gate lines at a ground or 0 potential, thereby turning off all the N channel field effect transistors. The bias voltage lines all receive a negative voltage causing the photodiode to be reverse biased during the acquisition stage of acquiring an image. During this period of time certain photodiodes are charged upon receiving light while other photodiodes which do not receive light do not build up a charge. After the image is acquired, the image is then read in a row by row manner by selectively turning on each gate line, whereby each field effect transistor coupled to the corresponding gate line discharges the photodiode through the field effect transistor into the corresponding data line, and the charge applied to the data line is read by a sense amplifier coupled to each data line which then can output a value for each pixel along a particular row. Each row is read one at a time by selectively activating one of the particular gate lines as is well known in the art.

Figure 3B:
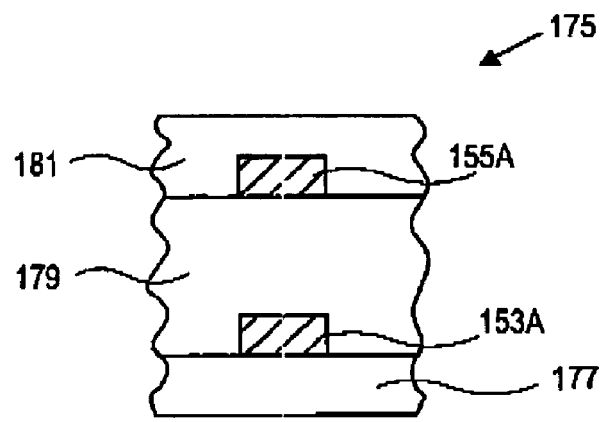
FIG. 3B is a cross sectional view taken at line 3B-3B of FIG. 3A.
Figure 3C:
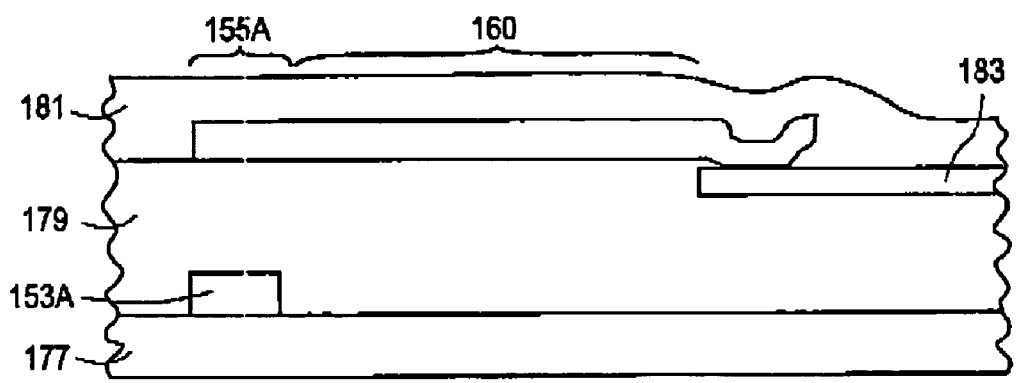
FIG. 3C is a cross section view of a photodetecting device taken at the line 3C-3C of FIG. 3A.

In one particular embodiment, the bias voltage lines may be arranged to be parallel with each gate line and to be immediately adjacent in a vertically arranged manner such as the manner shown in FIG. 3B and in FIG. 3C. FIG. 3B shows a cross sectional view of the bias voltage line 155A disposed over a gate electrode line 153A in a substrate. Substrate 177 and the insulator 179 and an insulator 181 form the remainder of the substrate which includes the bias voltage line 155A and the gate line 153A. In this cross sectional view, it can be seen that the bias voltage line is disposed above the gate line that is otherwise proximate or adjacent to the bias voltage line, separated in this case by an insulator 179. This cross sectional view shown in FIG. 3B is taken at the line 3B-3B shown in FIG. 3A. Another cross sectional view taken along the line 3C-3C show in FIG. 3A is shown in FIG. 3C. In this view of 3C, it can be seen that a portion of an electrode extends from the bias voltage line toward a structure 183 which is the photodiode structure or a portion of the photodiode structure such as a conducting layer coupled to the p+ electrode of the photodiode. It can be seen from this cross sectional view of FIG. 3C that there is no field effect transistor structure under the electrode portion 160, which will be described further below.

The arrangement of the bias voltage lines parallel with and potentially adjacent to the gate lines substantially decouples the capacitance between the bias voltage line and the data lines. Because the coupling between the gate lines and the bias voltage lines is less critical, the grid density along the gate line direction can remain at one line per pixel row as shown in FIG. 3A. However, this arrangement may not provide sufficiently low resistance for the bias voltage lines; for example the bias voltage lines may not meet an RC time constant requirement with the arrangement shown in FIG. 3A. The designs shown in FIGS. 4A, 4B, 5A, 5B, 5C, will however typically provide sufficiently low bias voltage line resistances in order for the bias voltage lines to meet the RC time constant requirements for the bias voltage lines.

It can be seen from FIGS. 4A, 5A, 5B, and 5C, that the bias voltage lines of the arrangements shown in these figures form a mesh in which there are two groups of bias voltage lines. The first group includes first bias lines and the second group includes second bias lines. The first bias lines are disposed in the first direction which is substantially parallel to the gate lines and the second bias lines are disposed in the second direction which are substantially perpendicular to the gate lines, and wherein a total length of the first bias lines exceeds a total length of the second bias lines. The second bias lines are coupled between the first bias lines to lower the overall resistance of the bias voltage lines. In this way, the capacitive coupling between the bias voltage lines and the data lines is minimized while also providing sufficient conductivity for the bias voltage lines.

Figure 4A:
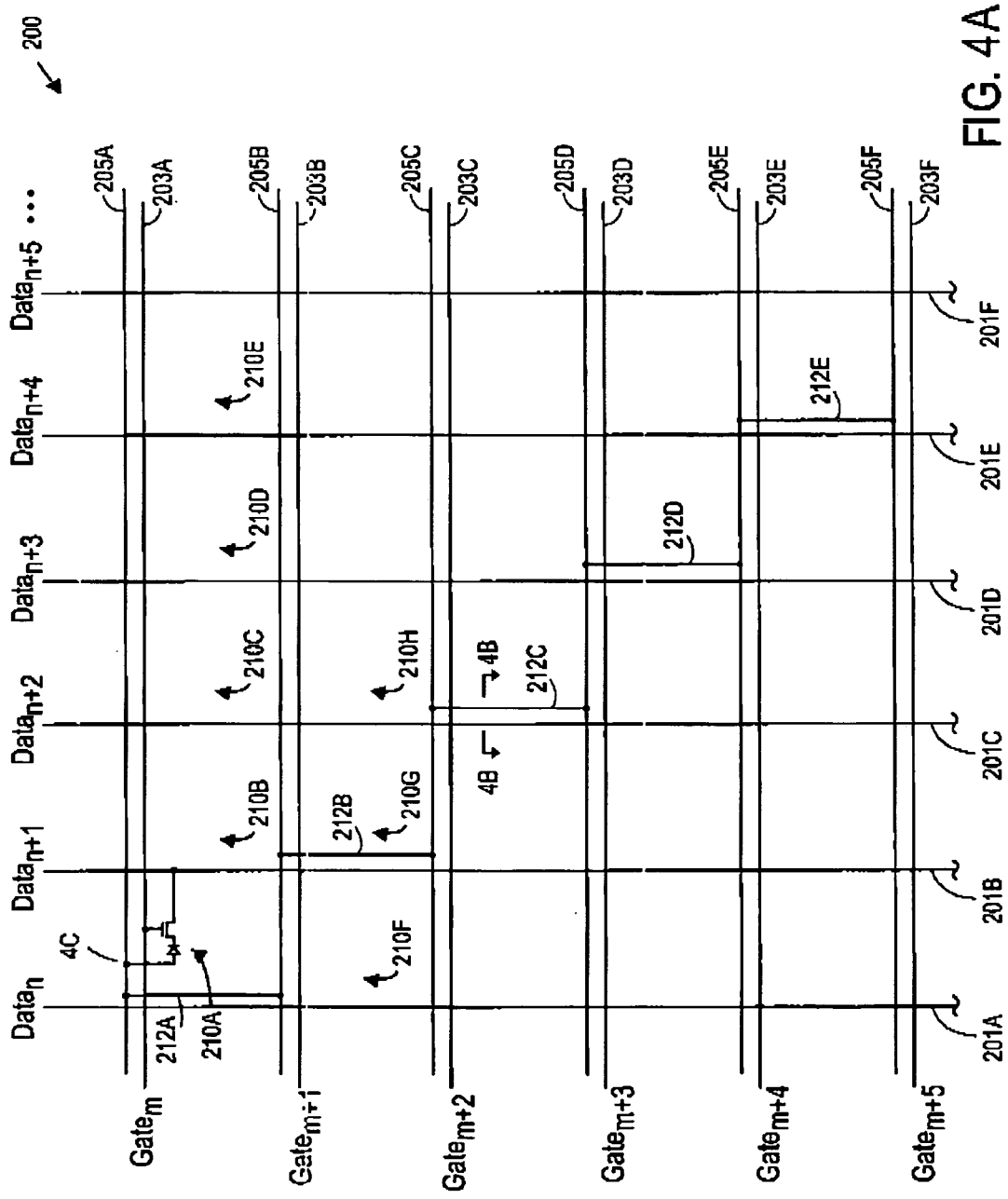
FIG. 4A shows an electrical schematic, and to a certain extent a layout architecture, of an exemplary embodiment of a photodetecting array of the present invention.

The photodetecting array 200 shown in FIG. 4A includes a plurality of detecting cells such as detecting cells 210A, 210B, 210C, through 210H, as well as further detecting cells which are formed at the intersection between two adjacent data lines and two adjacent gate lines as shown in FIG. 4A. Each detecting cell includes a photodiode coupled in series with a field effect transistor between a bias voltage line and a data line as shown in FIG. 4A. Thus the internal structure of each detecting cell maybe similar to that shown in FIG. 3A. The array 200 also includes a plurality of gate lines 203A through 203F and a plurality of bias voltage lines 205A through 205F, and further includes a plurality of data lines 201A through 201F. These data and gate lines and bias voltage lines function in a similar manner as their corresponding lines in FIG. 3A. The bias voltage lines 205A-205F are arranged parallel with the gate lines and may be disposed proximate to their corresponding gate line as shown in FIG. 3B and also as shown in the cross sectional view of FIG. 4B which is taken at the line 4B-4B shown in FIG. 4A. In addition, the array 200 maybe structured in such a way that the cross sectional view at area 4C of FIG. 4A is similar to that shown in FIG. 3C. The photodetecting array 200 also includes additional bias voltage lines 212A through 212E. Each of these additional bias voltage lines are arranged perpendicular to the gate lines and hence perpendicular to the bias voltage line 205A through 205F. Each of these additional bias voltage lines is coupled between adjacent bias voltage lines which run parallel with the gate lines. Thus, for example, the bias line 212A is coupled between bias voltage lines 205A and 205B and, the bias voltage line 212C is coupled between bias voltage lines 205C and 205D. These additional bias voltage lines reduce the overall resistance of the bias voltage line mesh while minimizing the capacitive coupling between the bias voltage lines and the data lines. It can be seen from the arrangement in FIG. 4A as well as the arrangements of the photodetecting arrays shown in FIGS. 5A, 5B, and 5C that the bias voltage lines form what may be considered to be a staircase grid in the photodetecting array.

Figure 4B:
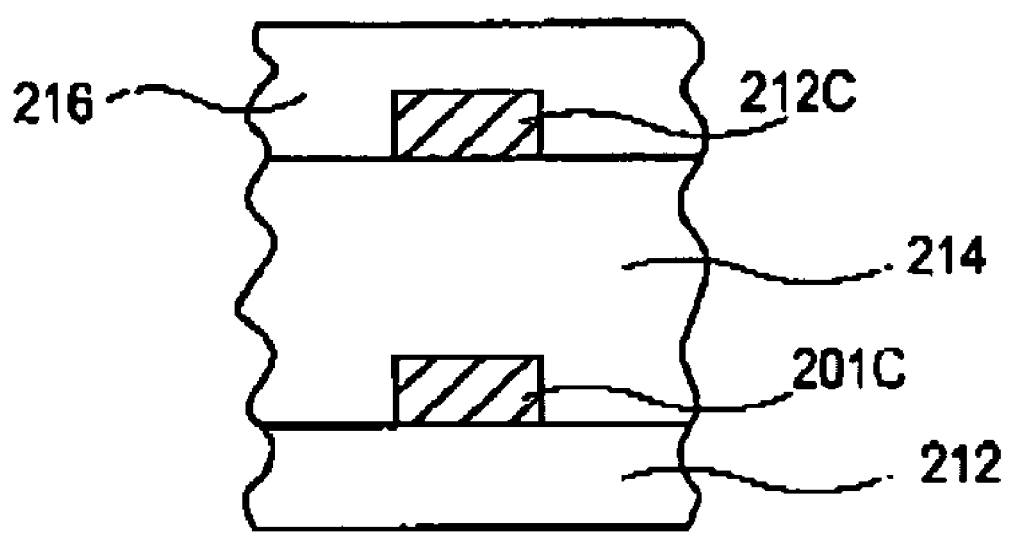
FIG. 4B shows a cross sectional view of a portion of a photodetecting device taken at the line 4B-4B shown in FIG. 4A.

The cross sectional view of FIG. 4B shows one embodiment of the photodetecting array in which the bias voltage lines are disposed proximate to or adjacent to data lines in addition to being parallel to a portion of those data lines. In particular as shown in FIG. 4B, the bias voltage line 212C which runs along only a portion of the data line 201C is proximate to and parallel to that portion in the region of the cross section shown in FIG. 4B. In this case the photodetecting array includes the substrate 212 on which the data line 201 is disposed and an insulator 214 which separates the data line 201C from the additional bias voltage line 212C which is itself encapsulated within an insulator 216 as shown in FIG. 4B.

Figure 5A:
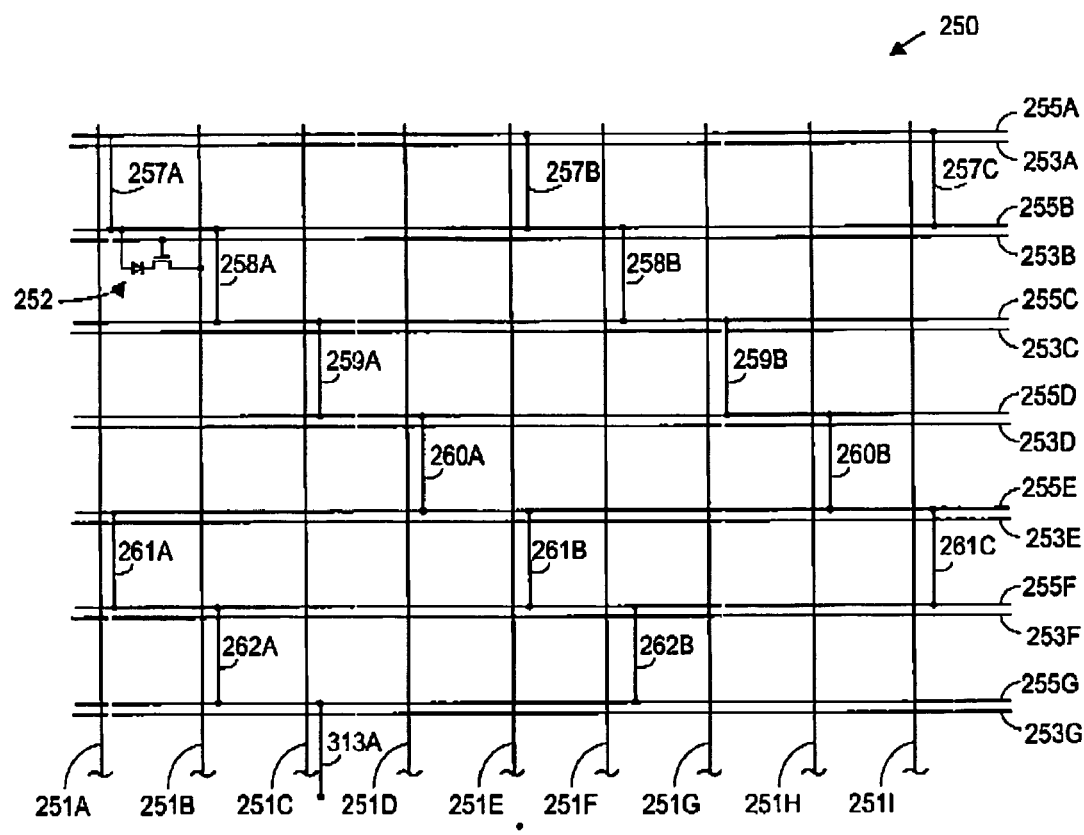
FIG. 5A shows an electrical schematic, and to a certain extent a layout architecture, of an exemplary embodiment of a photodetecting array of the present invention.

FIG. 5A shows another example of a photodetecting array which includes two groups of bias voltage lines, one group being parallel with the gate lines and another group being perpendicular to the gate lines as shown in FIG. 5A. Photodetecting array 250 includes a plurality of detecting cells such as the detecting cell 252 arranged in a grid within the array, where a detecting cell exists at the intersection of an adjacent pair of data lines and an adjacent pair of gate lines. Each detecting cell includes a photodetector coupled in series with a field effect transistor between a bias voltage line and a data line, while the gate of the field effect transistor is coupled to the gate line of the detecting cell, such as detecting cell shown as detecting cell 252 in FIG. 5A. The array 250 includes gate lines 253A through 253G and bias voltage lines 255A though 255G and further includes data lines 251A through 251I. An additional set of bias voltage lines forms a staircase pattern as shown in FIG. 5A. This additional set of bias voltage lines is perpendicular to the gate lines and may be disposed proximate to each data line in the manner shown in FIG. 4B. Alternatively, they may be parallel with the data lines but spaced away from the data lines (e.g. they may run along the center of the cell). These additional bias voltage lines serve to reduce the overall resistance of the mesh formed by the bias voltage lines. These additional bias voltage lines are coupled between adjacent and parallel bias voltage lines which are parallel to the gate lines. For example, the additional bias lines 257A, 257B, and 257C are coupled between the bias voltage lines 255A and 255B. The additional bias voltage lines also include lines 258A, 258B, 259A, 259B, 260A, 260B, 261A, 2614B, 261C, 262A, and 262B. It can be seen from the array 250 that there is a repeating pattern of 4 detecting cells between adjacent additional bias voltage lines, such as the bias voltage lines 257A and 257B.

Figure 5B:
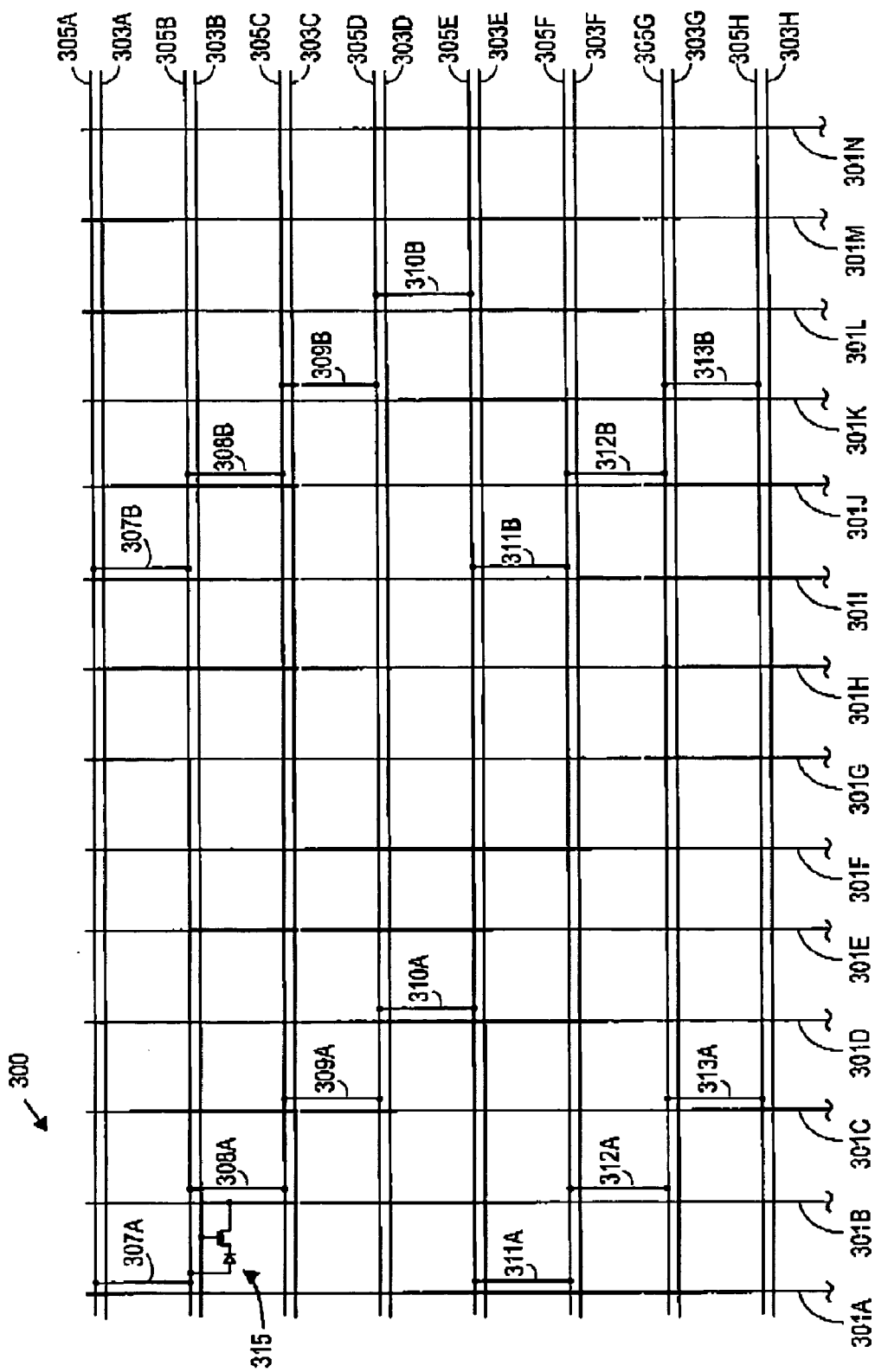
FIG. 5B shows an electrical schematic, and to a certain extent a layout architecture, of an exemplary embodiment of a photodetecting array of a present invention.

FIG. 5B shows another example of a photodetecting array 300 with additional bias voltage lines separated by a greater distance than the separation in the array shown in FIG. 5A. In particular, in the array 300 additional bias voltage lines 307A and 307B are separated by 8 detecting cells and this pattern repeats throughout the rest of the rows shown in FIG. 5B. The array 300 includes many detecting cells, such as the detecting cell 315 which maybe similar to the detecting cell 252 or the detecting cell 210A described above. The array 300 includes data lines 301A through 301N, and gate lines 303A through 303H, and bias voltage lines, which represent first bias voltage lines, 305A through 305H. In addition, there are additional bias voltage lines which form the second group of bias voltage lines and which include bias voltage lines 307A, 307B, 308A, 308B, 309A, 309B, 310A, 310B, 311A, 311B, 312A, 312B, 313A, and 313B. These additional bias voltage lines are perpendicular to the gate lines while the first group of bias voltage lines, lines 305A through 305H, are parallel with and maybe proximate to their corresponding gate lines. The additional bias voltage lines, in addition to being parallel with their corresponding data lines may also be proximate to their corresponding data lines in the manner shown in FIG. 4B.

Figure 5C:
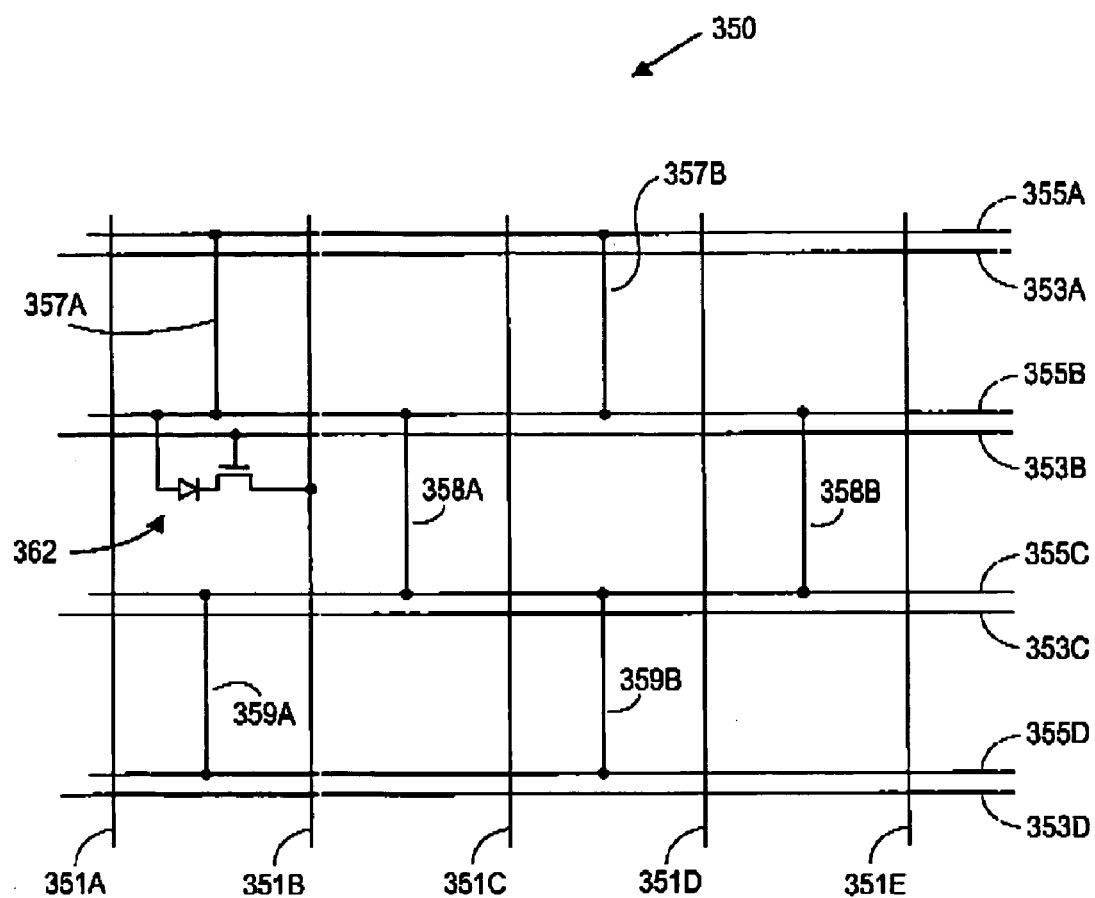
FIG. 5C shows an electrical schematic, and to a certain extent a layout architecture, of another exemplary embodiment of a photodetecting array of the present invention.

FIG. 5C shows another exemplary embodiment of a photodetecting array according to the present invention. In this array 350, the additional bias voltage lines are parallel with their corresponding data lines but are not proximate to their corresponding data lines. In this array 350, there are a plurality of detecting cells, such as detecting cell 362 which includes a photodiode and a field effect transistor coupled in the manner shown in FIG. 5C, which is similar to the cell 315 or cell 252 or cell 210A described above. Each detecting cell is located at an intersection between adjacent data lines and adjacent gate lines as shown in FIG. 5C. The array 350 includes gate lines 353A through 353D, and data lines 351A through 351E, and a first group of bias voltage lines 355A through 355D. In addition, the array 350 includes additional bias voltage lines (a second group of bias voltage lines 357A, 357B, 358A, 358B, 359A, and 359B), each of which is disposed parallel with their corresponding data line and perpendicular to the gate lines as shown in the array 350. This array 350 may again be considered to be a staircase grid formed by the mesh of the two groups of bias voltage lines. It will be appreciated that the second group of bias voltage lines is coupled between adjacent bias voltage lines of the first group of bias voltage lines. For example, the additional bias voltage line 357A is electrically coupled between adjacent bias lines 355A and 355B in the first group of bias voltage lines. In this manner, the overall resistance of the bias voltage lines is reduced while minimizing the capacitive coupling between the bias voltage lines and the corresponding data lines. To further minimize capacitive coupling, the NIP sensor structure maybe segmented such that there is no overlap of the sensor structure (e.g. the photodiode) with a gate and data lines to minimize capacitive coupling. However, in certain applications overlap of the NIP photodiode with a gate and date line may be tolerable particularly if a low k dielectric is used depending on specific application dependant trade-offs between pixel structure and coupling capacitive. It will be appreciated that the connection between the bias line and the n electrode of the photodiode (in this case an NIP photodiode) may be positioned directly above the thin film field effect transistor where this contact serves a secondary function as a light shield for the thin film transistor to suppress potential light induced leakage currents. It can been seen from the examples provided in FIGS. 5A through 5C that the bias metal grid for each row of pixels maybe staggered with each row off set from the proceeding row by 1 pixel. Therefore, the bias/data coupling is the same on each line but the coupling capacitance on each data line is reduced in proportion to the grid density.

Figure 6:
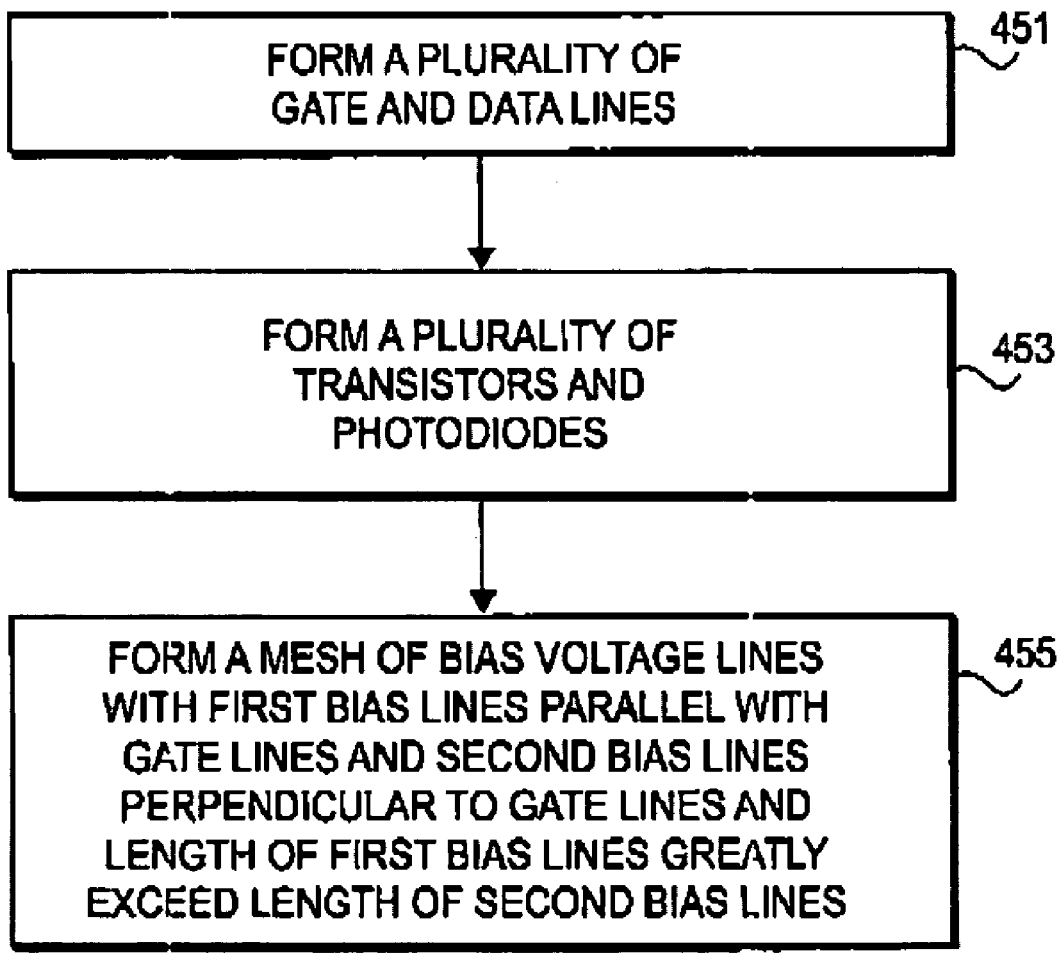
FIG. 6 shows a flow chart of a method for making a photodetecting array.

FIG. 6 is a flow chart which shows an exemplary method for forming a bias voltage line mesh as describe above. In this method, the plurality of gate and data lines may be formed on a substrate in operation 451. A plurality of transistors and photodiodes which are coupled to these gate and data lines may be formed in operation 453. Finally a mesh of bias voltage lines may be deposited above the remainder of the structure in operation 455. This mesh may include first bias lines which are parallel with the gate lines and second bias lines which are perpendicular to the gate lines, where the length of the first bias lines greatly exceeds (e.g. more than 10 times) the length of the second bias lines.

Another aspect of this disclosure will now be described while referring to FIGS. 7A, 7B, 8, and 9.

Figure 7A:
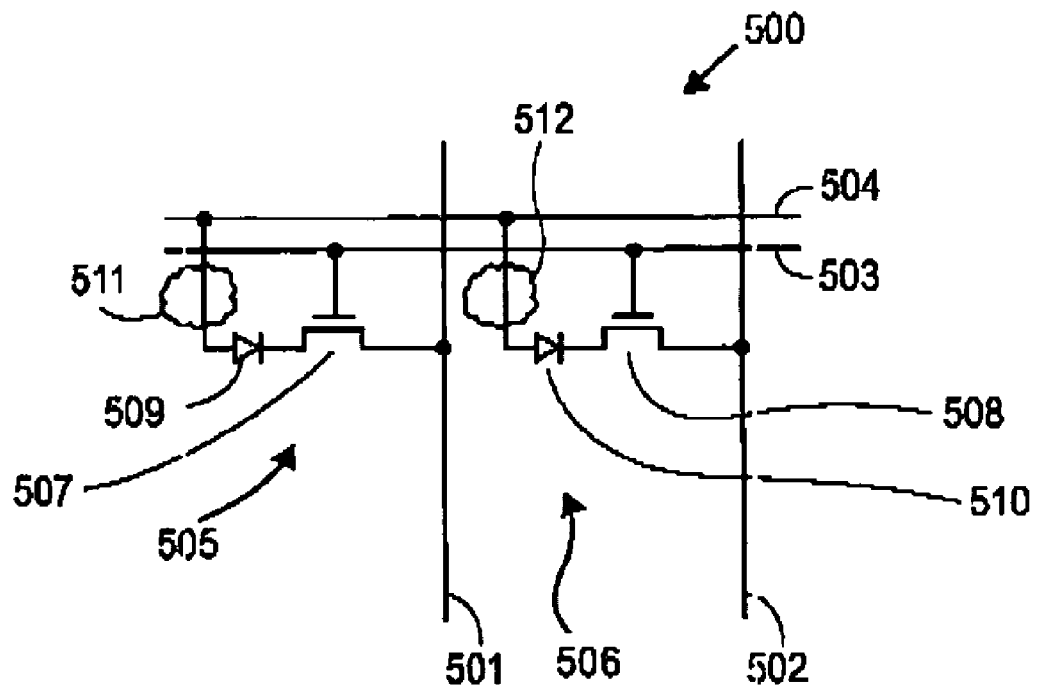
FIGS. 7A and 7B show electrical schematics of a photodetecting array which includes bias voltage lines which have pixel defect correcting portions.
Figure 7B:
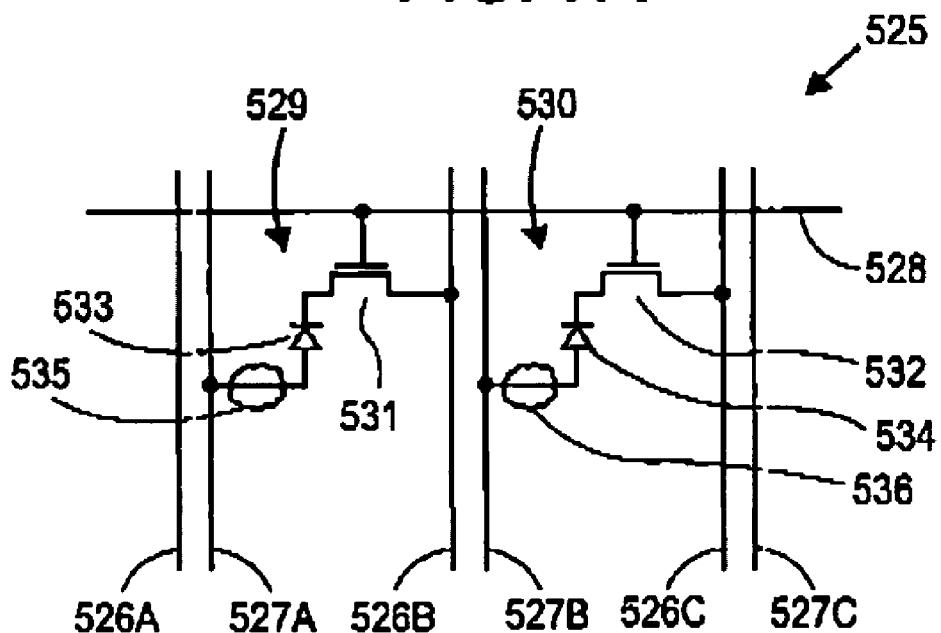

FIGS. 7A and 7B respectively show photodetecting arrays 500 and 525, each of which include a plurality of detecting cells arranged in an array, where each of the detecting cells includes a photodiode and a transistor and further includes a pixel defect correcting portion on an associated bias voltage line within each detecting cell. The photodetecting array 500 includes data lines 501 and 502 and a gate line 503 and a bias voltage line 504. It will be appreciated that additional rows of detecting cells and additional columns of detecting cells may be included in this array 500 (not shown). A detecting cell 505 includes a thin film field effect transistor 507, the source and drain of which is coupled in series between the data line 501 and the n electrode of the photodiode 509. The gate electrode of the field effect transistor 507 is coupled to the gate line 503. Similarly, the detecting cell 506 includes field effect transistor 508 and a photodiode 510 coupled to the array as shown in FIG. 7A. The p+ electrode of the photodiode 509 is coupled to a pixel defect correcting portion 511 which is between the bias voltage line 504 and the p+ electrode of the photodiode 509. Similarly, the p+ electrode of the photodiode 510 is coupled to a pixel defect correcting portion 512 which is between the bias voltage line 504 and the p+ electrode of the photodiode 510. The pixel defect correcting portions 511 and 512 maybe severed by a laser to thereby isolate one or more of the detecting cells from the bias voltage line 504. Other techniques to sever the connection between the bias voltage line 504 and a corresponding detecting cell may be used rather than a laser. If the connection is severed, then the detecting cell may be disconnected from the array by severing the associated pixel defect correcting portion. As could be seen from FIG. 7A, the bias voltage line 504 may be laid out parallel to the gate line 503. Further, it may be laid out so that the two lines are proximate to each other such as the arrangement shown in FIG. 3B. It will be appreciated that an additional defect correcting portion may be included within each detecting cell to provide further reliability in disconnecting a particular detecting cell from the rest of the array. For example, the connection between the source electrode of each field effect transistor and its corresponding data line may include a pixel defect correcting portion or the connection between the drain electrode of each field effect transistor and the n electrode of the corresponding photodiode may also include a pixel defect correcting portion. Examples of such additional pixel defect correcting portion are described in U.S. Pat. No. 6,437,341.

Photodetecting array 525 shows an alternative embodiment which uses bias voltage lines having a pixel defect correcting portion. In this alternative embodiment, the bias voltage lines 527A and 527B and 527C are disposed parallel with and potentially proximate to the data lines 526A, 526B, and 526C. A pixel defect correcting portion 535 couples a detecting cell 529 which includes a field effect transistor 531 and a photodiode 533 to the bias line 527A. Similarly, the pixel defect correcting portion 536 on a bias line couples the detecting cell 530, which includes the field effect transistor 532 and the photodiode 534, to the bias voltage line 527B. It will be appreciated that the detecting cell to the right of detecting cell 530 is coupled to the bias voltage line 527C in a similar manner. The gate electrodes of field effect transistors 531 and 532 are coupled to the gate line 528 as shown in FIG. 7B. The pixel defect correcting portions 535 and 536 which are disposed on bias voltage lines may be selectively removed to disconnect the corresponding detecting cell from its bias voltage line. As with the example shown in FIG. 7A, additional pixel defect correcting portions may be included in each detecting cell, such as an additional defect correcting portion which disconnects the source electrode of the field effect transistor from its corresponding data line.

Figure 8:
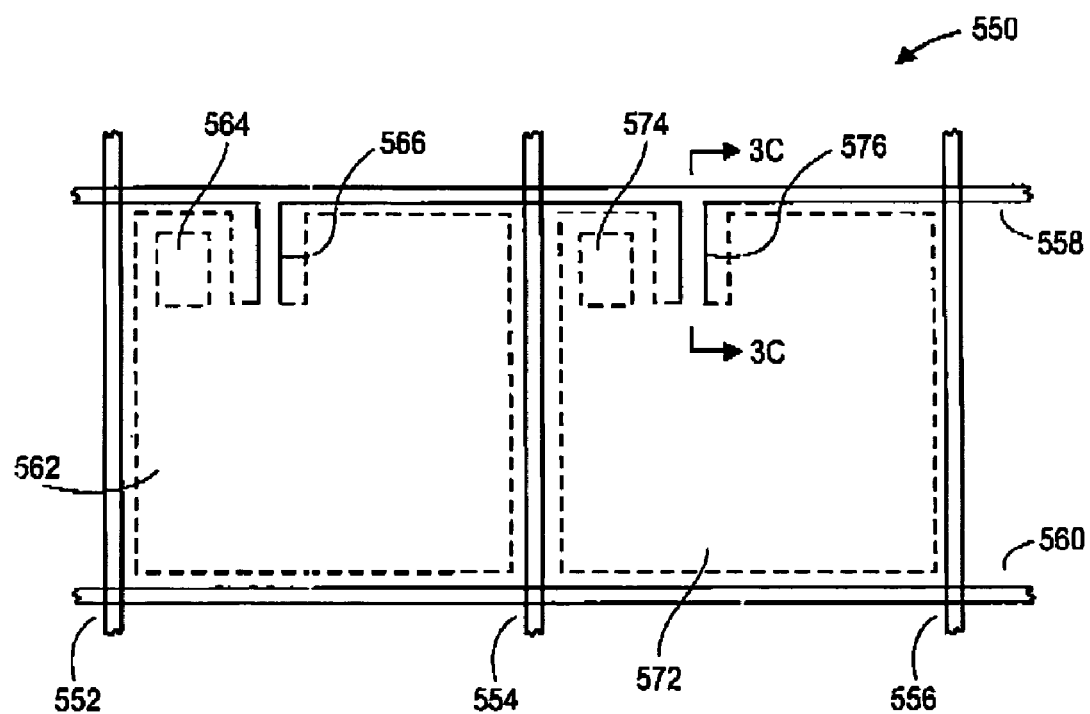
FIG. 8 shows a top view of a photodetecting array containing bias voltage lines which include pixel defect correcting portions.

FIG. 8 shows a top view of a layout in a fabricated substrate of a photodetecting array which includes pixel defect correcting portions disposed on bias voltage lines at the connection between the bias voltage and photodiode of each detecting cell. The view shown in FIG. 8 is a top view which also shows some of the underlying features of the array. The photodetecting array 550 of FIG. 8 includes data lines 552, 554, 556 which are vertically disposed and which are typically in a bottom plane of a substrate of the array 550. Bias voltage lines 558, 560 are disposed in an upper plane and perpendicular to the data lines 552, 554, and 556. The gate lines are not shown but they are typically also in a bottom layer below the bias voltage lines and they may be parallel with the bias voltage lines as in the example shown in FIG. 7A and in FIG. 3B. Further, there may be additional bias voltage line disposed along a portion or parallel with a portion of the data lines, such as the arrangement shown in FIG. 4A. Each detecting cell includes a photodiode such as the photodiodes 562 and 572 and a field effect transistor such as field effect transistors 564 and 574. The photodiode and the field effect transistors are coupled in the manner shown in FIG. 3A. It would be appreciated that the connections between the photodiode and the field effect transistor and between the field effect transistor and the gate lines and the data lines are not shown in FIG. 8 in order to simplify FIG. 8. Each detecting cell shown in the array 550 includes a pixel defect correcting portion, such as pixel defect correcting portion 566 and 576 which couples its corresponding photodiode to a bias voltage line. In the case of the pixel defect correcting portion 566, this portion couples the photodiode 562 to the bias voltage line 558, and the pixel defect correcting 576 couples the photodiode 572 to the bias voltage line 558. One implementation of this connection is shown in the cross sectional view of FIG. 3C which is taken at the line 3C-3C shown in FIG. 8. It can be seen that the pixel defect correcting portion corresponding to the electrode 160 extends in the upper surface of the array over the substrate 177. It can also be seen that the photodiode does not exists in the region surrounding this pixel defect correcting portion. This allows a laser to selectively remove the pixel defect correcting portion without causing undue damage to the photodiode structure which may be adjacent to the pixel defect correcting portion. In an alternative embodiment, the point of connection between the pixel defect correcting portion and the photodiode may be disposed over the field effect transistor so that the bias contact area may serve as a light shield for the field effect transistor to suppress potential light induced leakage in the field effect transistor.

The array shown in FIG. 8 is one in which the photodiode is integrated vertically above the field effect transistor in order to provide a high fill factor detecting cell where most of the area of the detecting cell is covered by the photodiode such as photodiode 562 or 572 shown in FIG. 8. This is similar to the structure shown in U.S. Pat. No. 5,619,033. In the architecture of the array shown in FIG. 8 the photodiode (an NIP photodiode) has no overlap relative to the gate and data lines and also no overlap relative to the bias voltage lines which in this architecture are disposed above the gate and data lines at the top of the array. It will be appreciated that the pixel defect correcting portion, such as portions 566, 576 may be formed with thinner and smaller metal lines or conducting lines which are thinner than the rest of the bias voltage lines in order to make it easier to sever this portion by use of the laser or other techniques.

Figure 9:
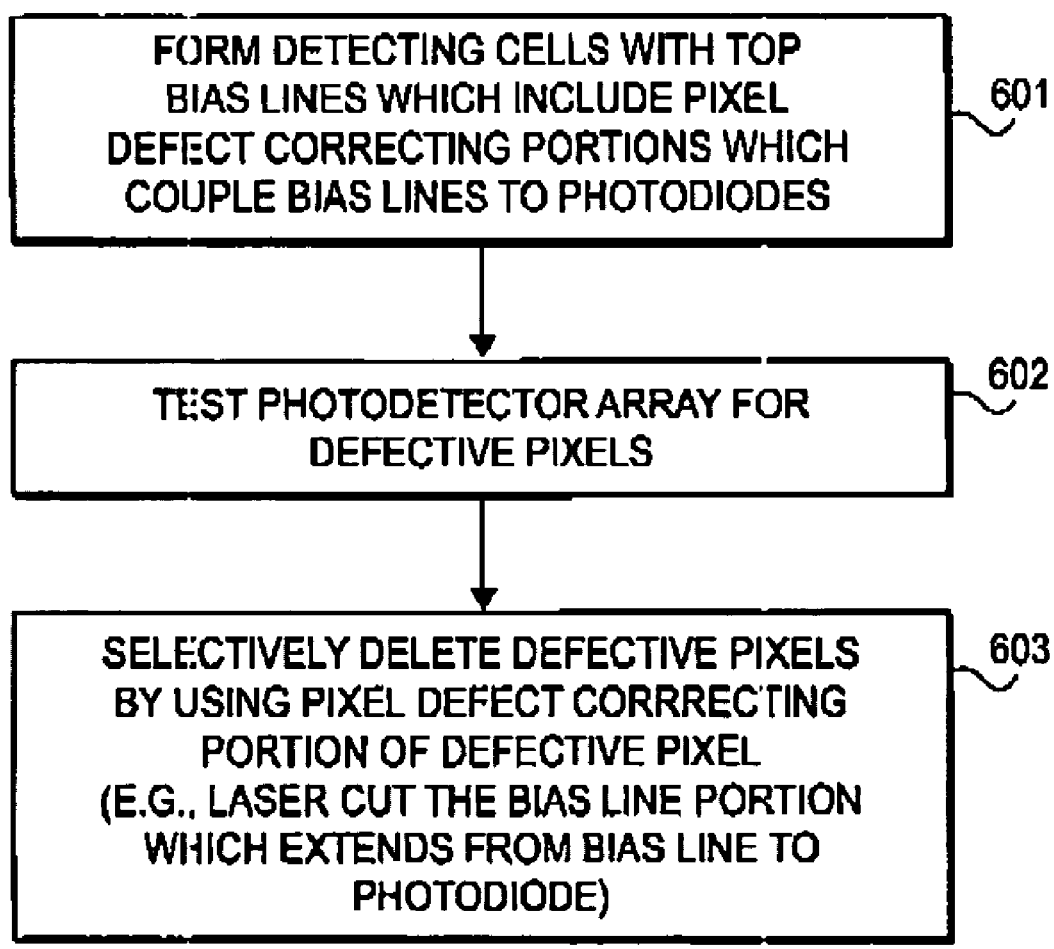
FIG. 9 shows a flow chart of one exemplary method of forming a photodetecting array which includes pixel defect correcting portions.

FIG. 9 shows an exemplary method of fabricating an array such as 550. In this method, detecting cells are formed in operation 601. These detecting cells have bias lines at the top of the array and include pixel defect correcting portions which couple the bias lines to photodiodes in the array. In operation 602, the array is tested for defective pixels, and in operation 603 defective pixels are selectively deleted by using the pixel defect portion. This may be done by using a laser to cut the top bias line portions which extend the bias line to the photodiode. In addition, additional pixel defect correcting portions, such as those which couple the field effect transistor to the data lines may also be severed.

While this invention has been described in conjunction with various embodiments thereof, it is evident that many alternatives and modifications and variations may be made by those skilled in the art. Accordingly, the embodiments set forth herein are intended to be illustrative and not limiting. Various changes may be made without departing from the spirit and scope of the invention as defined in the following claims.

What is claimed is:

1. A photodetecting array comprising: a plurality of detecting cells laid out in an array on a substrate, comprising rows and columns of detecting cells; a plurality of gate lines, wherein each of the gate lines are coupled to a different row of more than two detecting cells; a plurality of data lines, wherein each of the data lines are coupled to a different column of more than two detecting cells; a mesh of bias voltage lines, comprising a plurality of additional bias voltage lines and a plurality of main bias voltage lines to reduce capacitive coupling, wherein each of the additional bias voltage lines are coupled between at least a pair of main bias lines; wherein each of the main bias voltage lines are coupled to a different row of more than two detecting cells; and wherein the gate lines and main bias voltage lines are laid out in a plurality of rows and the data lines and additional bias voltage lines are laid out in a plurality of columns.

2. A photodetecting array as in claim 1 wherein each of said plurality of detecting cells comprises a transistor and a photodiode, and wherein one of said plurality of gate lines is coupled to said transistor and one of said plurality of data lines is coupled to said transistor.

3. A photodetecting array as in claim 2 wherein said photodiode comprises:
an n+ layer formed over a first passivation layer;
an amorphous silicon layer formed over said n+ layer;
a p+ layer formed over said amorphous silicon layer; and
a conductive layer formed over said p+ layer.

4. A photodetecting array as in claim 2 wherein each photodiode in said array is segmented from other photo diodes in said array.

5. A photodetecting array as in claim 4 wherein said photodiode in a cell is disposed above said transistor in said cell.

6. A photodetecting array as in claim 5 wherein each said photodiode comprises:
an n+ layer formed over a first passivation layer;
an amorphous silicon layer formed over said n+ layer,
a p+ layer formed over said amorphous silicon layer; and
a conductive layer formed over said p+ layer.

7. A photodetecting array as in claim 1 wherein said plurality of main bias voltage lines and plurality of additional bias voltage lines, together, form a staircase grid of bias voltage lines comprises a first plurality of main bias voltage lines which are laid out parallel to and proximate to corresponding gate lines and a second plurality of additional bias voltage lines which are laid out parallel to and proximate to only a portion of said plurality of data lines, said second plurality of additional bias voltage lines being coupled electrically between said first plurality of main bias voltage lines.

8. A photodetecting array as in claim 7 wherein a capacitive coupling between said second plurality of additional bias voltage lines and said plurality of data lines is limited substantially to said portion.

9. A photodetecting device comprising:
   a first row of more than two detecting cells, each having a transistor and a photodiode;
   a second row of more than two detecting cells, each having a transistor and a photodiode, said second row being adjacent to and parallel with said first row;
   a first gate line coupled to said first row;
   a second gate line coupled to said second row;
   a mesh of bias voltage lines, comprising additional bias voltage lines and main bias voltage lines, wherein each of the additional bias voltage lines are coupled between at least a pair of main bias voltage lines; wherein the main bias voltage lines comprises:
      a first main bias voltage line laid out parallel with and proximate to said first gate line and coupled to more than two detecting cells in said first row; and
      a second main bias voltage line laid out parallel with and proximate to said second gate line and coupled to more than two detecting cells in said second row; and
   wherein the additional bias voltage lines comprises:
      a third additional bias voltage line laid out parallel with and proximate to a first data line, said third additional bias voltage line being electrically coupled between said first main bias voltage line and said second main bias voltage line;
   wherein the capacitive coupling between the mesh of bias voltage lines and the data lines is substantially limited to the capacitive coupling between the third additional bias voltage line and the first data line.

10. A photodetecting device as in claim 9 wherein said first and said second main bias voltage lines provide a reverse bias voltage to photodiodes in said first row of detecting cells and in said second row of detecting cells.

11. A photodetecting device as in claim 9, further comprising:
    a second data line; and
    a fourth additional bias voltage line laid out parallel with and proximate to said second data line, said fourth additional bias voltage line being electrically coupled to said second main bias voltage line and to a fifth main bias voltage line.

12. A photodetecting device as in claim 11 wherein said first data line and said second data line are laid out substantially perpendicular to said first gate line and to said second gate line and wherein said third additional bias voltage line is not coupled to said fifth main bias voltage line and wherein said fourth additional bias voltage line is not coupled to said first main bias voltage line.

13. A photodetecting device as in claim 12 wherein said first gate line is coupled to transistors in said first row of detecting cells and said second gate line is coupled to transistors in said second row of detecting cells.

14. A photodetecting device as in claim 9 wherein each photodiode in said first row and in said second row of detecting cells is segmented from other photodiodes.

15. A photodetecting device as in claim 14 wherein said photodiode in a cell is disposed above said transistor in said cell.

16. A photodetecting device as in claim 15 wherein each said photodiode comprises:
    an n+ layer formed over a first passivation layer;
    an amorphous silicon layer formed over said n+ layer;
    a p+ layer formed over said amorphous silicon layer; and
    a conductive layer formed over said p+ layer.

17. A photodetecting array comprising:
    a plurality of detecting cells laid out in an array on a substrate, wherein said array comprises rows and columns of detecting cells, wherein each of the said detecting cells comprising a photodiode and a transistor;
    a plurality of gate lines laid out parallel to the rows of the array, wherein each of the gate lines are coupled to one of said rows of more than two detecting cells;
    a plurality of data lines laid out parallel to the columns of the array, wherein each of the data lines are coupled to one of said column of detecting cells;
    a mesh of bias voltage lines, said mesh comprising first main bias voltage lines disposed in a first direction which is laid out substantially parallel to said gate lines and second additional bias voltage lines disposed in a second direction which is laid out substantially perpendicular to said gate lines,
    wherein each of the additional bias voltage lines are coupled between at least a pair of main bias voltage lines,
    wherein a total length of said first main bias voltage lines exceeds a total length of said second additional bias voltage lines, and
    wherein the capacitive coupling between the bias voltage lines and the data lines is proportional to the total length of the second additional bias voltage lines.

18. A photodetecting array as in claim 17 wherein said total length of said first main bias voltage lines greatly exceeds said total length of said second additional bias voltage lines by a factor of at least 10 times, and wherein said first main bias voltage lines are proximate to corresponding said gate lines.

19. A method for manufacturing a photodetecting array, said method comprising:
    forming a plurality of gate lines;
    forming a plurality of transistor structures laid out in an array, the array comprising rows and columns;
    forming a plurality of data lines laid out in columns, wherein the data lines are coupled to said transistor structures laid out in columns of the array;
    forming a plurality of photodiode structures over the transistors;
    forming a mesh of bias voltage lines, said mesh comprising first main bias voltage lines disposed in a first direction which is laid out substantially parallel to and proximate to said gate lines and second additional bias voltage lines disposed in a second direction which is laid out substantially perpendicular to said gate lines,
    wherein each of the additional bias voltage lines are coupled between at least a pair of main bias voltage lines, wherein a total length of said first main bias voltage lines exceeds a total length of said second additional bias voltage lines, and wherein the capacitive coupling between the bias voltage lines and the data lines is proportional to the total length of the second additional bias voltage lines.

20. The photodetecting array of claim 1, wherein the total length of the additional bias voltage lines are substantially less than the total length of the main bias voltage lines.

21. The photodetecting array of claim 2, wherein the transistor is coupled to the gate line by a first pathway and to the data line by a second pathway, and wherein the photodiode is coupled to the transistor by a third pathway and to the main bias voltage line by a fourth pathway, wherein the first, second, third, and fourth pathways are all distinct and separate from each other.

22. The photodetecting array of claim 21, wherein the main bias voltage lines are laid out parallel to the gate lines and perpendicular to the data lines.

23. The photodetecting array of claim 1, wherein the capacitive coupling between the plurality of bias voltage lines and the data lines are limited substantially to the proportional length of the additional bias voltage lines to the total length of the plurality of bias voltage lines; and wherein the additional bias voltage lines substantially reduces the resistance of the main bias voltage lines.

24. The photodetecting array of claim 17, wherein the capacitive coupling between the plurality of bias voltage lines and the data lines are limited substantially to the proportional length of the additional bias voltage lines to the total length of the plurality of bias voltage lines.

25. The photodetecting array of claim 18, wherein the capacitive coupling between the plurality of bias voltage lines and the data lines are limited substantially to the proportional length of the additional bias voltage lines to the total length of the plurality of bias voltage lines; and wherein the additional bias voltage lines substantially reduces the resistance of the main bias voltage lines.

26. The photodetecting array of claim 9, wherein the transistor is coupled to the gate line and the data line, and wherein the photodiode is coupled to the transistor and the main bias voltage line.

27. The photodetecting array of claim 17, wherein the transistor is coupled to the gate line and the data line, and wherein the photodiode is coupled to the transistor and the main bias voltage line.

28. A photodetecting array comprising:

a plurality of detecting cells laid out in an array on a substrate, wherein said array comprises rows and columns of detecting cells, wherein each of the said detecting cells comprising a photodiode and a transistor;

a plurality of gate lines laid out parallel to the rows of the array, wherein each of the gate lines are coupled to one of said rows of more than two detecting cells;

a plurality of data lines laid out parallel to the columns of the array, wherein each of the data lines are coupled to one of said columns of detecting cells;

a mesh of bias voltage lines, comprising additional bias lines and main bias lines, wherein each of the additional bias lines are coupled between at least a pair of main bias lines;

the mesh having a means for limiting the capacitive coupling between the bias voltage lines and the data lines.

* * * * *